United States Patent [19]
Torii

[11] Patent Number: 5,747,385
[45] Date of Patent: May 5, 1998

[54] METHOD OF PLANARIZING INTERLAYER DIELECTRIC

[75] Inventor: Kouji Torii, Tokyo, Japan

[73] Assignee: NEC Corporation, Japan

[21] Appl. No.: 687,843

[22] Filed: Jul. 26, 1996

[30] Foreign Application Priority Data

Jul. 28, 1995 [JP] Japan .................................. 7-193706

[51] Int. Cl.$^6$ .............................................. H01L 21/469
[52] U.S. Cl. ......................... 438/690; 438/974; 438/691; 156/636.1
[58] Field of Search .................................. 437/231, 946, 437/228, 974; 156/636.1; 438/977, 974, 693, 690, 691, 692

[56] References Cited

U.S. PATENT DOCUMENTS

| | | | |
|---|---|---|---|
| 4,655,847 | 4/1987 | Ichinoseki et al. | 134/7 |
| 5,009,240 | 4/1991 | Levi | 134/7 |
| 5,209,028 | 5/1993 | McDermott et al. | 134/7 |
| 5,318,926 | 6/1994 | Dlugokecki | 437/923 |
| 5,348,615 | 9/1994 | Gupta | 437/228 |
| 5,376,579 | 12/1994 | Annamalai | 437/974 |
| 5,514,624 | 5/1996 | Morozumi | 437/231 |

FOREIGN PATENT DOCUMENTS 6-196573  7/1994  Japan .

OTHER PUBLICATIONS

Sivaram et al; "Planarizing Interlevel Dielectrics by Chemical–Mechanical Polishing"; May 1992; pp. 87–91; Solid State Technology.

Ali et al; "Chemical–mechanical polishing of interlayer dielectric: A review"; Oct. 1994; pp. 63–64, 66, 68; Solid State Technology.

Warnock; "A Two–Dimensional Process Model for Chemi-mechanical Polish Planarization"; Aug. 1991; pp. 2398–2402; J. Electrochem. Soc. vol. 138, No. 8.

Primary Examiner—John Niebling
Assistant Examiner—Kevin F. Turner
Attorney, Agent, or Firm—Hayes, Soloway, Hennessey, Grossman & Hage, P.C.

[57] ABSTRACT

A method of planarizing an interlayer dielectric layer in a semiconductor integrated circuit device is provided, which method can remove remaining parts of the dielectric layer without removing the surface of the layer itself at a high throughput. After an insulating layer is formed on a chief surface of the semiconductor substructure, an interconnection layer having interconnection lines is formed on the insulating layer. An interlayer dielectric layer is formed on the insulating layer so as to cover the interconnection layer. The dielectric layer has steps or protrusions at positions corresponding to the underlying interconnection lines of the interconnection layer. Next, a patterned resist film is formed on the interlayer dielectric layer so as to have an inverted geometric shape relative to that of the interconnection layer. Then, using the patterned resist film as a mask, the interlayer dielectric layer is selectively etched to thereby partially remove the top of the protrusions by a predetermined depth. Subsequently, a beam of hard or solid particles is emitted so as to collide with the remaining parts of the protrusions of the interlayer dielectric layer, thereby removing the protrusions.

5 Claims, 9 Drawing Sheets

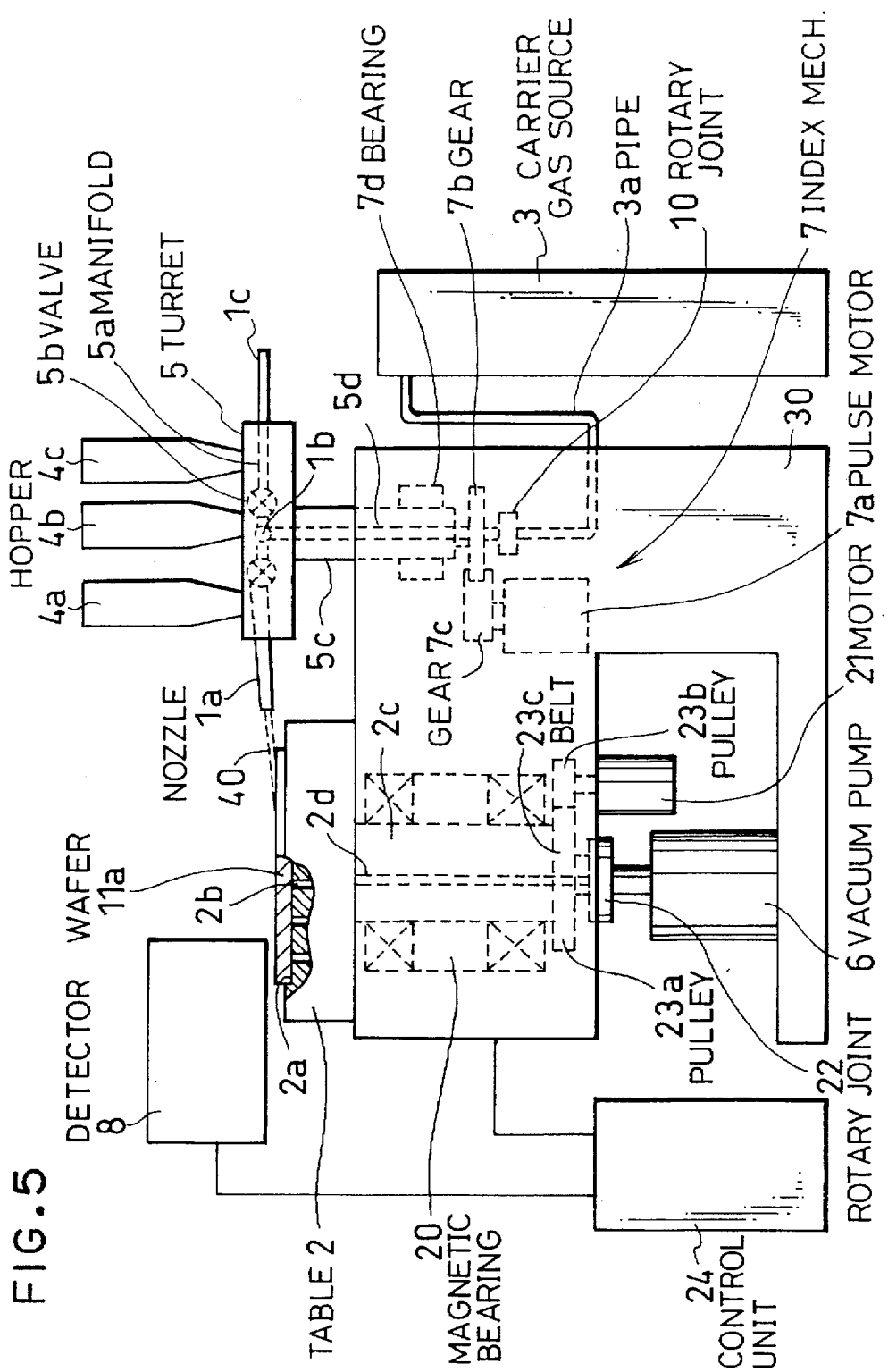

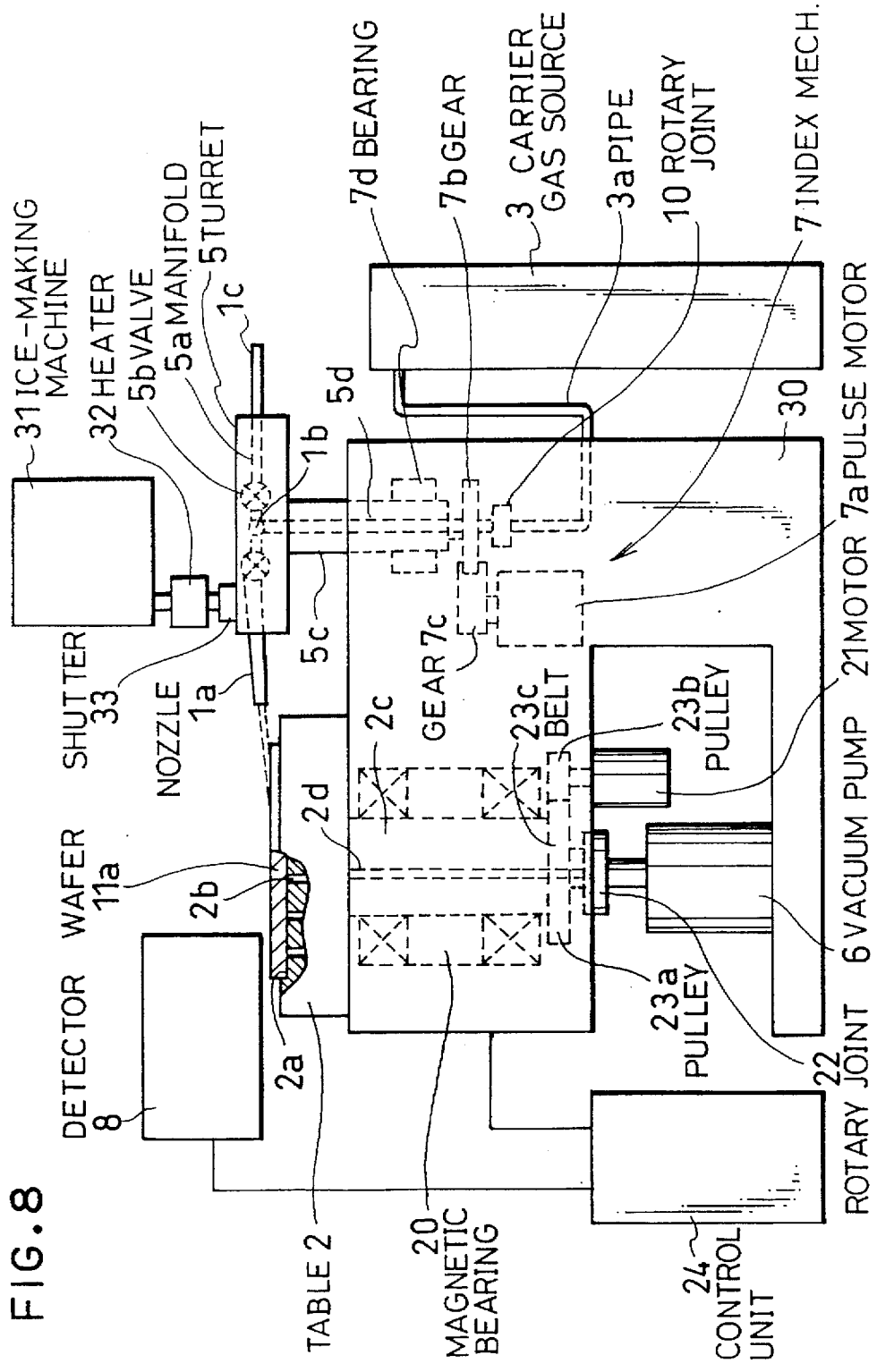

METHOD OF PLANARIZING INTERLAYER DIELECTRIC

BACKGROUND OF THE INVENTION

1. Field of the Invention

The present invention relates to a planarization technique for an interlayer dielectric and, more particularly, to a method and equipment for planarizing an interlayer dielectric in a semiconductor integrated circuit device, which suitable for global planarization of a semiconductor wafer surface.

2. Description of Related Prior Art

As conventional planarization methods of this sort thermal flow (reflow), Spin On Glass (SOG) and etchback methods have been known and are being used. These conventional planarization methods are suitable for local planarization of topography of an interlayer dielectric.

However, problems of various restrictions for these conventional methods have occurred because margins of depth of focus of exposure systems have decreased with increasing device density or integration scale of Large-Scale Integrated circuit devices (LSI).

On the other hand, recently, as a planarization method suitable for global planarization, the Chemical-Mechanical Polishing (CMP) method was developed and has been used. In the CMP method, a semiconductor wafer is held on a rotating carrier and a polishing pad is attached onto a rotating table. The pad is then contacted with the surface of the dielectric layer on the wafer while a slurry is supplied as a polishing medium to the contact area of the dielectric surface with the pad, thereby mechanically and chemically polishing the surface to be planarized. The surface of the dielectric layer is planarized by removing the hills and valleys on the surface.

With the CMP method, however, the following problem occurs. Specifically, it is difficult to control the thickness of the remaining dielectric layer after planarization. As a result, it is possible that the underlying interconnection/wiring layer will become partially exposed by the remaining dielectric layer.

To solve the above problems of conventional planarization methods, a planarization method using an argon (Ar) ion stream has been developed, which is explained below referring to FIGS. 1A to 1F.

First, as shown in FIG. 1A, an insulating layer 112 is formed on a chief surface of a semiconductor substructure 111. Typically, the substructure 111 contains a semiconductor substrate and a plurality of semiconductor active and passive elements formed on the substrate. Next, an interconnection layer 113 with a thickness $T_{113}$ of approximately 0.8 μm, which is made of a patterned aluminum (Al) alloy layer, is formed on the insulating layer 112. For the sake of simplification, only two conductive lines of the interconnection layer 113 are illustrated in FIG. 1A.

Then, an interlayer dielectric layer 114 with a thickness of approximately 1.2 μm, which is made of silicon dioxide ($SiO_2$), is formed on the insulating layer 112 to cover the interconnection layer 113 by a plasma-enhanced Chemical Vapor Deposition (CVD) technique. At this stage, as shown in FIG. 1A, the surface of the dielectric layer 114 thus formed has steps or protrusions 115 at positions corresponding to the underlying conductive lines of the interconnection layer 113.

For example, the height $H_{115}$ of each protrusion 115 is approximately equal to the thickness $T_{113}$ (i.e., 0.8 μm) of the interconnection layer 113. The width $W_{115}$ of each protrusion 115 is wider than the width $W_{113}$ of a corresponding one of the conductive lines of the interconnection layer 113. If the interval of the neighboring conductive lines of the interconnection layer 113 is approximately 1.2 μm or more, the neighboring protrusions will be separately formed, as shown in FIG. 1A. However, if the interval of the neighboring lines of the interconnection layer 113 is approximately 1.2 μm or less, the neighboring protrusions will be merged together, resulting in a single protrusion.

Next, as shown in FIG. 1B, a photoresist film 116 is formed on the interlayer dielectric layer 114 and then is patterned to have an inverted geometric shape relative to the pattern of the interconnection layer 113 by a photolithography technique. Here, the "inverted geometric shape" of the photoresist film 116 means that the photoresist film 116 has windows 116a through which the conductive lines of the interconnection layer 113 are selectively removed during a subsequent etching process. Specifically, the patterned photoresist film 116 has the same pattern as that of a patterned photoresist film for the interconnection layer 113; however, both of the photoresist films have the relationship that the regions of the photoresist film 116 to be left are removed in the photoresist film for the interconnection layer 113 and the regions of the photoresist film 116 to be removed are left in the photoresist film for the interconnection layer 113.

Using the patterned photoresist film 116 as a mask, the interlayer dielectric layer 114 is selectively etched by an isotropic etching method, thereby removing the top of the protrusions 115 by a depth of $D_{11}$, as shown in FIG. 1C. For example, the isotropic etching method may be a wet etching method using a buffered hydrofluoric acid, and the depth $D_{11}$ may be approximately 0.1 to 0.3 μm.

Subsequently, using the same photoresist film 116 as a mask, the interlayer dielectric layer 114 is selectively etched again by an anisotropic etching method, thereby removing further the top of the protrusions 115 by a depth of $D_{12}$, as shown in FIG. 1D. For example, the anisotropic etching method may be a Reactive Ion Etching (RIE) method using $CF_4$, or $CHF_3$ gas, and the depth $D_{12}$ may be approximately 0.7 to 0.5 μm. At this stage, the thickness of the remaining dielectric layer 114 on its top is, for example, approximately 0.4 μm, and the thickness fluctuation thereof is within the range of approximately ±0.1 μm. The photoresist film 116 is then removed.

Since the width $W_{115}$ of the protrusions 115 of the interlayer dielectric layer 114 is wider than the width $W_{113}$ of each conductive line of the interconnection layer 113, the protrusions 115 are not entirely etched through the above two etching processes. As a result, unetched parts 117 of the protrusions 115 are left over both sides of each conductive line of the interconnection layer 113, as shown in FIG. 1E.

Finally, a stream of Ar ions accelerated at an energy of 100 eV or less is produced and emitted toward the surface of the interlayer dielectric layer 114 in a direction perpendicular to the surface of the layer 114. The unetched parts 117 are selectively removed by the Ar ion stream due to a sputter ion etching process. As a result, the surface of the layer 114 is planarized, as shown in FIG. 1F.

The selective removal of the unetched parts 117 is performed for the following reason:

The sputtering rate of the $SiO_2$ layer 114 depends upon the incident angle of the Ar ion stream. Specifically, the sputtering rate at the incedent angle of 45° is greater than that at 90°. Since the unetched parts 117 are generated by the isotropic etching process, they have oblique faces on their top ends. Accordingly, when Ar ion stream is irradiated onto the surface of the dielectric layer 114 at 90° the unetched parts 117 having the oblique faces tend to be etched faster than the flat surface of the layer 114. In other words, the planarization of the layer 114 is accomplished by the etching rate difference between the unetched parts 117 and the surface of the layer 114.

Following this, necessary contact holes (not shown) are formed in the interlayer dielectric layer 114 so as to reach the corresponding conductive lines of the interconnection layer 113 by using conventional methods. A next-level interconnection layer (not shown) is formed on the planarized layer 114 so as to cover the next-level interconnection layer. Further, a next-level interlayer dielectric layer is formed on the underlying next-level interconnection layer. These process steps are repeated a necessary number of times, thereby fabricating a semiconductor integrated circuit device with multi-level interconnection.

With the conventional planarization method using the Ar ion stream, the selective removal of the unetched parts 117 is realized by using a sputtering rate change or difference of the Ar ion stream as a function of the incident angle. As a result, the problem exists that the flat surface itself of the interlayer dielectric layer 114 is also etched during the planarization process occurs.

For example, when the unetched parts 117 of the interlayer dielectric layer 114 has a height of 1 µm, the surface of the layer 114 also is etched by a depth of approximately 0.1 µm.

This means that although the conventional planarization method using the Ar ion stream can provide better selectivity than that of the conventional CMP method, it has the same problem as the CMP method related to the thickness controllability of the dielectric layer 114.

The conventional planarization method using the Ar ion stream has another problem of low throughput. Specifically, when the unetched parts 117 of the interlayer dielectric layer 114 have a height of 1 µm, it takes a long time (e.g., approximately six minutes) to entirely remove the parts 117. Additionally, considering the fact that this method requires vacuum-pumping and gas-introduction times for preparing the Ar ion stream, throughput further decreases.

To increase throughput, the acceleration energy for the ion stream may be raised. However, the raised acceleration energy causes selectivity reduction and as a result, the possibility arises that thickness of the dielectric layer 114 may become excessively thin arises.

Further, in the conventional planarization method using the Ar ion stream, broken pieces of the dielectric layer 114 tend to be blown apart therefrom during the planarization process. The broken pieces thus blown tend to beome adhered again onto the surface of the layer 114. At the same time, they tend to collide with the inner wall of the reaction chamber of the planarization equipment, thereby sputtering contaminants from the wall. These phenomena induce other problems, such as short-circuits in the interconnection layer 113.

SUMMARY OF THE INVENTION

Accordingly, an object of the present invention is to provide a method and equipment for planarizing an interlayer dielectric layer that can solve the above problem related to the thickness controllability of the dielectric layer.

Another object of the present invention is to provide a method and equipment for planarizing an interlayer dielectric layer that can remove remaining parts of the dielectric layer without removing the surface of the layer itself.

Still another object of the present invention is to provide a method and equipment for planarizing an interlayer dielectric layer that enables high throughput for the planarization process.

A further object of the present invention is to provide a method and equipment for planarizing an interlayer dielectric layer that can solve the above problem due to contaminants.

According to a first aspect of the present invention a method of planarizing an interlayer dielectric layer is provided, which includes the following steps.

After an insulating layer is formed on a chief surface of a semiconductor substructure, an interconnection layer having conductive lines is formed on the insulating layer. An interlayer dielectric layer is formed on the insulating layer so as to cover the interconnection layer. The interlayer dielectric has steps of protusions at positions corresponding to the underlying conductive lines of the interconnection layer.

Next, a patterned photoresist film is formed on the interlayer dielectric layer so as to have an inverted geometric shape relative to that of the interconnection layer. Then, using the patterned photoresist film as a mask, the interlayer dielectric layer is selectively etched to thereby partially remove the top of the protrusions by a predetermined depth.

Subsequently, a beam of hard or solid particles is emitted so as to collide with remaining parts of the protrusions of the interlayer dielectric layer, thereby removing the protrusions.

With the method of planarizing the interlayer dielectric layer according to the first aspect of the invention, to remove the remaining protrusions of the interlayer dielectric layer, a beam of solid particles is emitted so as to collide with the protrusions.

Accordingly, the protrusions can be removed without removing the surface of the interlayer dielectric layer if the incident angle of the beam is set such that the beam does not damage the surface of the dielectric layer. This means that the interlayer dielectric layer can be planarized while solving the above problem related to thickness controllability of the dielectric layer.

Since the remaining parts of the protrusions of the dielectric layer are removed by collision with the beam of solid particles, a high removing rate can be obtained, resulting in high throughput for the planarization process.

Further, because the beam of solid particles produces no sputtering phenomenon, the above problem due to the sputtering-generated contaminants can be solved.

It is preferred that the beam of solid particles be produced by emitting solid particles from a nozzle together with an inert gas.

As the solid particles, any solid particles or pieces may be used if they can break the remaining parts of the protrusions of the dielectric layer by collision therewith.

In a preferred embodiment of the method according to the first aspect, the size of the solid particles is changed during the step of removing the remaining parts of the protrusions of the interlayer dielectric.

In another preferred embodiment of the method according to the first aspect, granular $SiO_2$ pieces are used as the solid particles collided with the protrusions.

In still another preferred embodiment of the method according to the first aspect, ice pieces made of pure water are used as the solid particles collided with the protrusions.

The size of the solid particles is adjusted dependent upon the thickness of the remaining parts of the protrusions to be removed and the emitting speed of the beam. It is preferred that the size of the particles be larger than the thickness of the protrusions.

Since the removing or breaking force of the beam is dependent upon the momentum of each particle, the emitting speed is preferably adjusted according to the mass of each particle. For example, since an ice particle has a smaller mass than that of an $SiO_2$ particle, the emitting speed for an ice particle is set to be greater than that for an $SiO_2$ particle.

According to a second aspect of the present invention, equipment for planarizing an interlayer dielectric layer is provided, which includes a rotatable table for holding a semiconductor substructure having an interlayer dielectric layer, and a beam generator for generating a beam of solid particles. The beam generator has a nozzle from which the beam is emitted.

The beam of the solid particles emitted from the nozzle is collided with remaining parts of the protrusions of the interlayer dielectric layer, thereby removing the protrusions.

In the equipment for planarizing an interlayer dielectric layer according to the second aspect, the semiconductor substructure is held on the rotatable table, and the beam of ice solid particles generated by the beam generator is emitted from the nozzle toward the protrusions of the interlayer dielectric layer. The beam of solid particles thus emitted is collided with the remaining parts of the protrusions of the dielectric layer. As a result, the protrusions are broken by the collision and removed from the dielectric layer.

Thus, the method according to the first aspect can be performed by this equipment.

In a preferred embodiment of the equipment according to the second aspect, the equipment further comprises an end-point detector for detecting the end point of a planarization process.

Preferably, the end-point detector comprises a loading pad for applying a load onto the interlayer dielectric layer, and a load sensor for sensing the change of the load. The end point of the planarization process is detected through change in the load.

In another preferred embodiment of the equipment according to the second aspect, the beam generator can generate a plurality of beams of solid particles having different sizes, and a plurality of nozzles are provided for alternately emitting a corresponding one of the beams therefrom.

In this embodiment, an additional advantage exists in that even if the protrusions of the dielectric layer have a tendency to crumble, the protrusions can be securely removed without damage of the flat surface of the dielectric layer.

BRIEF DESCRIPTION OF THE DRAWINGS

In order that the invention may be readily carried into effect, it will now be described with reference to the accompanying drawings.

FIG. 5 is a schematic side view of planarization equipment used for the planarization methods according to the first and second embodiments.

FIG. 8 is a schematic side view of other planarization equipment used for a planarization method according to a third embodiment of the invention.

DETAILED DESCRIPTION OF THE PREFERRED EMBODIMENTS

Preferred embodiments of the present invention will be described below with reference to the attached drawings.

FIRST EMBODIMENT

Figure 6:
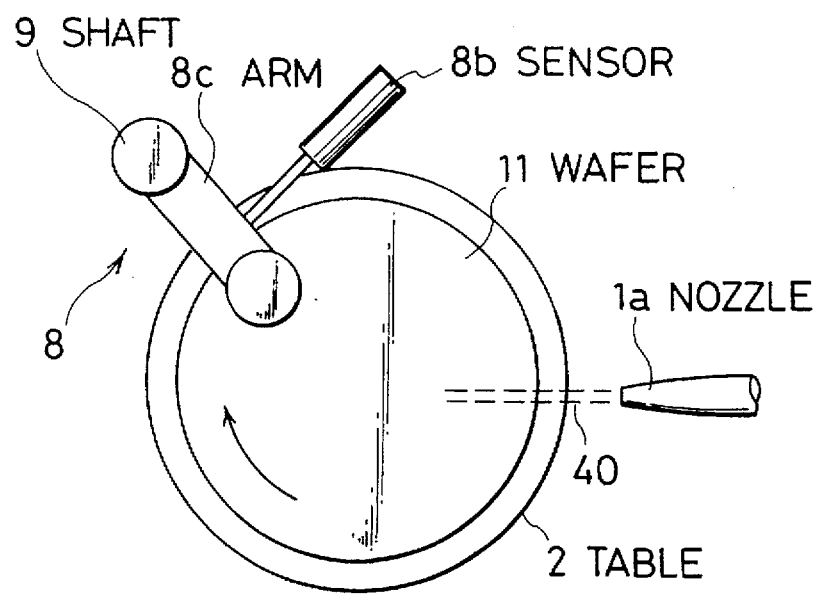
FIG. 6 is a schematic plan view of the planarization equipment shown in FIG. 5.
Figure 7:
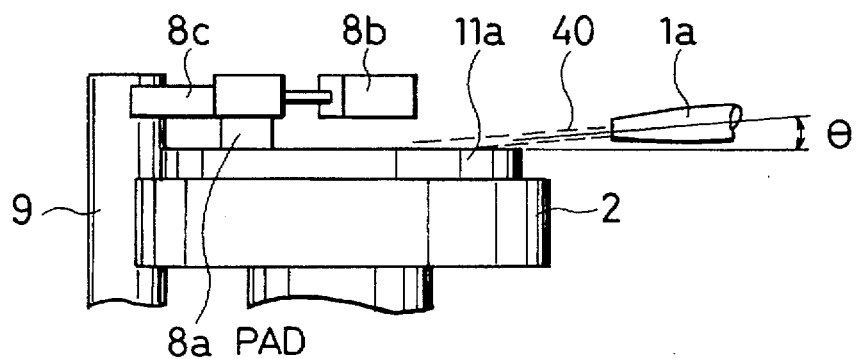
FIG. 7 is a schematic side view of the planarization equipment shown in FIG. 5.

In a method of planarizing an interlayer dielectric layer according to a first embodiment, planarization equipment as shown in FIGS. 5, 6 and 7 is used. Therefore, the equipment will be explained prior to the method.

As shown in FIG. 5, this equipment has three nozzles 1a, 1b and 1c from each of which a beam 40 of solid particles is alternately emitted, three hoppers 4a, 4b and 4c for storing $SiO_2$ particles or pieces serving as the solid particles, a rotatable table 2 on which a semiconductor wafer 11a with an interlayer dielectric layer to be planarized is held, and a carrier gas source 3 for supplying a carrier gas to the nozzles 1a, 1b and 1c.

The nozzles 1a, 1b and 1c are fixed to the side face of a turret 5 so as to radially extend in a horizontal plane. The nozzles 1a, 1b and 1c are arranged at an interval of 90° around the center of the turret 5.

The turret 5 has a manifold 5a communicating with the nozzles 1a, 1b and c, three valves 5b for opening and closing the flow paths to the respective nozzles 1a, 1b and 1c, and a vertically extending shaft 5c. The shaft 5c is rotatably supported by an indexing mechanism 7 provided in a body 30 of the equipment. The shaft 5c has a coaxially extending communication path 5d through which the solid particles are transported to the nozzles 1a, 1b and 1c.

The indexing mechanism 7 serves to index any one of the nozzles 1a, 1b and 1c for a desired planarization process. This mechanism 7 has pulse motor 7a fixed in the body 30, a gear 7c fixed to the shaft of the motor 7a, and a gear 7b fixed to the shaft 5c of the manifold 5. The rotation motion of the motor 7a is transmitted to the manifold 5 through engaged gears 7b and 7c, thereby turning the manifold 5 in a horizontal plane around the shaft 5c. Any one of the nozzles 1a, 1b and 1c is alternately faces the table 2 depending upon the rotation angle of the motor 7a.

The three hoppers 4a, 4b and 4c, which are fixed onto the turret 5, serve to store the $SiO_2$ particles having different sizes or diameters, respectively. The $SiO_2$, particles stored in the hopper 4a have a relatively large diameter. The $SiO_2$, particles stored in the hopper 4b have a middle diameter. The $SiO_2$ particles stored in the hopper 4c have a relatively small diameter.

The SiO₂ particles stored in each of the hoppers 4a, 4b and 4c are supplied to a corresponding one of the nozzles 1a, 1b and 1c through a corresponding one of shutters (not shown) in the hoppers 4a, 4b and 4c, respectively.

A carrier gas is supplied from the gas source 3 to the communication path 5d of the turret 5 through a pipe 3a and a rotary joint 10. The gas is further send to the manifold 5a if tge tyrret 5 and then, emitted from the nozzles 1a, 1b or 1c through a corresponding one of the valves 5b, respectively. The gas supply to the nozzles 1a, 1b and 1c is controlled by the valves 5b.

The carrier gas serves to carry the SiO₂ particles from the hoppers 4a, 4b and 4c to a corresponding one of the nozzles 1a, 1b and 1c, and to emit them as a beam 40.

The carrier gas source 3 includes a container (not shown) for storing a carrier gas therein, a pressure regulator (not shown) for regulating the pressure of the carrier gas, and a gas flow controller (not shown) for controlling the flow rate of the carrier gas. The controller is used for setting the emitting speed of the SiO₂ particles.

As the carrier gas, any inert gas may preferably be used. However, nitrogen ($N_2$) is not preferred.

The table 2 has a depression 2a on its upper surface, vertically penetrating through holes 2b, and a supporting shaft 2c. The substrate or wafer 11 is placed on the table 2 in the depression 2a. The through holes 2b communicate with a vacuum pump 6 fixed to the body 30 through a vertically extending communication path 2d formed in the shaft 2c. The wafer 11a can be securely held on the table 2 by a vacuum absorbing force generated by the pump 6.

The shaft 2c of the table 2 is rotatably supported by the body 30 through a magnet bearing 20. The shaft 2c is rotated by a motor 21 fixed to the body 30 through a pulley 23a fixed to the shaft 2c and a pulley 23b fixed to a shaft of the motor 21. The rotation of the motor 21 is transmitted to the shaft 2c through the pulleys 23a and 23b and a belt 23c bridging between the pulleys 23a and 23b.

To facilitate holding of the wafer 11a on the table 2 and removal of the wafer therefrom, the piping system of the vacuum pump 6 has an opening/closing valve and a leakage valve (both not shown).

The equipment further includes an end-point detector 8 for detecting the completion of the planarization process. As shown in FIGS. 6 and 7, the detector 8 has a horizontally extending arm 8c one end of which is connected to a vertically extending supporting shaft 9. A contact pad 8a is attached to the other end of the arm 8c. A pressure sensor 8b, which serves to sense friction force between the pad 8a and the surface to be planarized, is fixed to the arm 8c. The pad 8a serves as a counter weight for the sensor 8b also. The arm 8c can be turned in a horizontal plane around the shaft 9. To avoid any damage to the wafer 11a, a soft, polyurethane polymer sheet (not shown) is attached onto the contact area of the pad 8a.

The pad 8a is contacted with the surface of the dielectric layer of the wafer 11a during planarization process. When the surface of the dielectric layer is planarized, friction force between the pad 8a and the surface becomes extremely low (e.g., substantially zero). Accordingly, resistive force against the rotation of the wafer 11a decreases, resulting in the minimum value of the output of the sensor 8b. Thus, the user or operator can notice the endpoint of the planarization process through any alarm.

As a simple variation of end-point detection, a control current of the motor 21 for rotating the table 2 may be detected, where the control current is current which flows through the motor 21 to provide its steady rotation. This is based on the fact that the load of the table 2 varies due to the friction force change during the planarization process, and control current varies depending upon the load.

A control unit 24 controls the overall operation of this planarization equipment. Specifically, unit 24 controls the selection of nozzles 1a, 1b and 1c, supply of the carrier gas, open/close operation of the valves 5b, rotation of the motors 7a, and 21 for the table 2 and turret 5, operation of the vacuum pump 6, and operation of the end-point detector 8.

Next, the planarization method according to the first embodiment will be explained below with reference to FIGS. 2A to 2H.

Figure 1A:
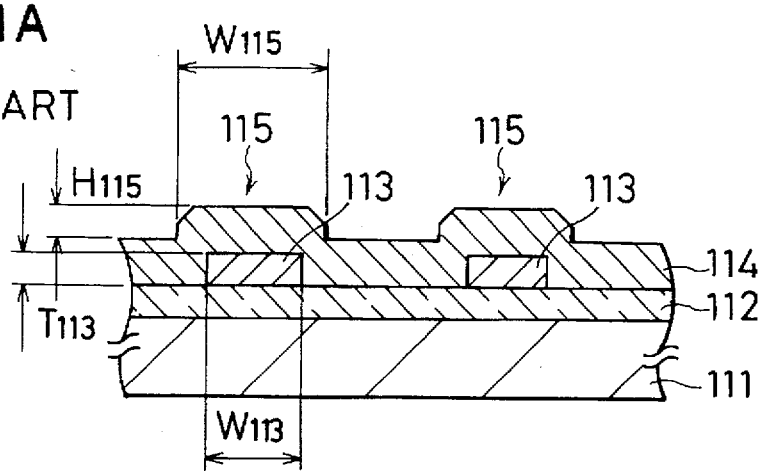
FIGS. 1A to 1F are partial cross-sectional views of a semiconductor substructure, and show a process step sequence of a conventional planarization method using an Ar ion stream.
Figure 1B:
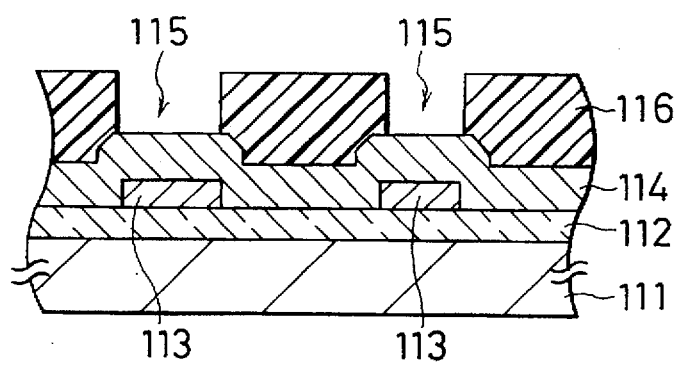
Figure 1C:
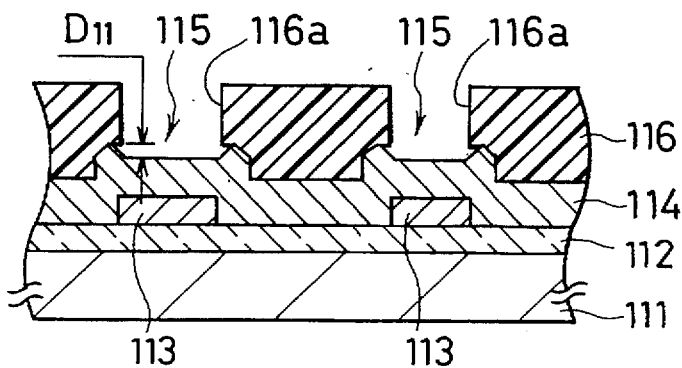
Figure 1D:
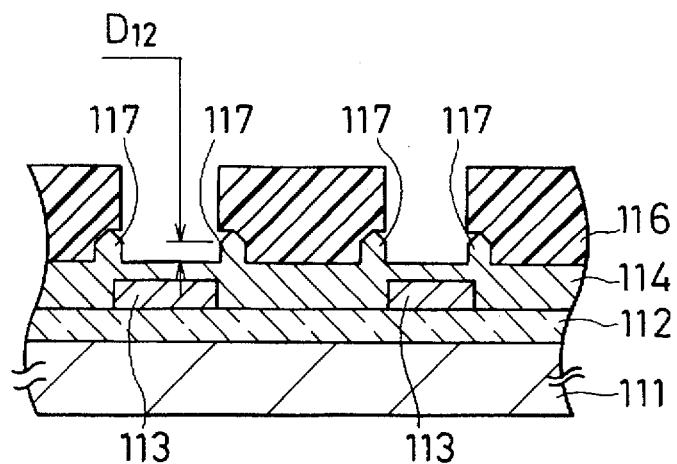
Figure 1E:
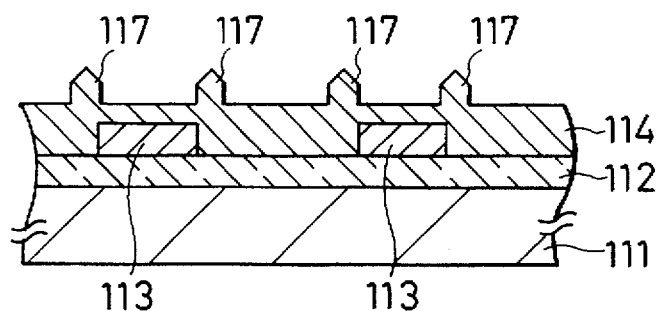
Figure 1F:
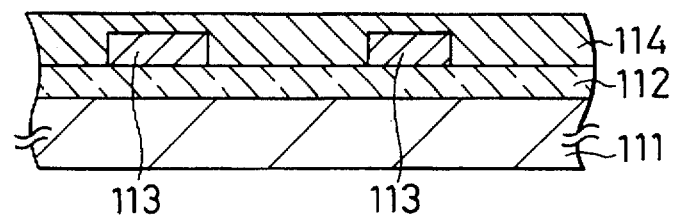
Figure 2A:
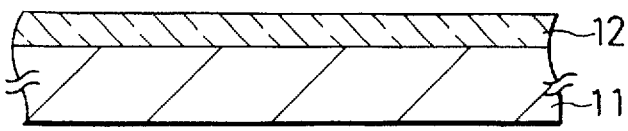
FIGS. 2A to 2H are partial cross-sectional views of a semiconductor substructure, and show a process step sequence of a planarization method according to a first embodiment of the invention.

First, as shown in FIG. 2A, an insulating layer 12 is formed on a chief surface of a semiconductor substructure 11. Typically, the substructure 11 contains a semiconductor substrate and a plurality of semiconductor active and passive elements formed on the substrate.

Figure 2B:
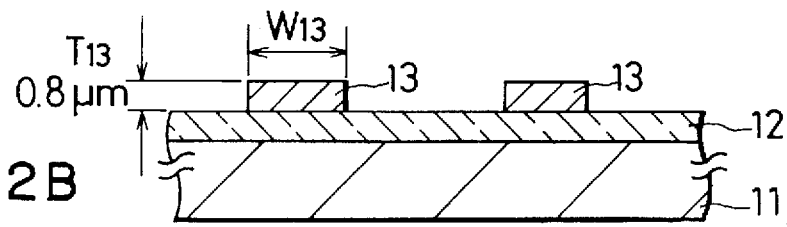

Next, an interconnection layer 13 with a thickness $T_{13}$ of approximately 0.8 μm, which is made of a patterned Al alloy layer, is formed an the insulating layer 12. For the sake of simplification, only two lines of the interconnection layer 13 are illustrated in FIG. 2B.

Figure 2C:
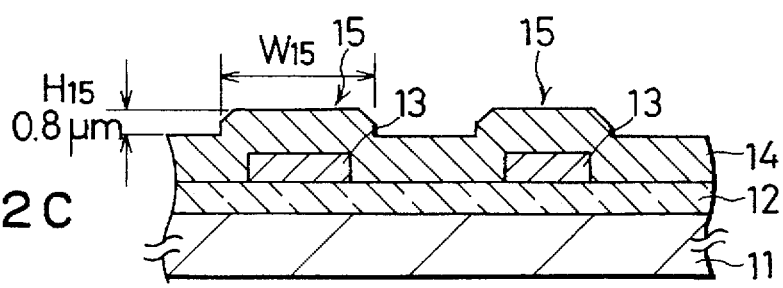

Then, an interlayer dielectric layer 14 with a thickness of approximately 1.2 μm, which is made of SiO₂, is formed an the insulating layer 12 so as to cover the interconnection layer 13 by a plasma-enhanced CVD technique. At this stage, as shown in FIG. 2C, the surface of the dielectric layer 14 thus formed has steps or protrusions 15 at positions corresponding to the underlying lines of the interconnection layer 13.

For example, the height $H_{15}$ of each protrusion 15 is approximately equal to the thickness $T_{13}$ (i.e., 0.8 μm) of the interconnection layer 13. The width $W_{15}$ of each protrusion 15 is wider than the width $W_{13}$ of a corresponding one of the lines of the interconnection layer 13.

Figure 2D:
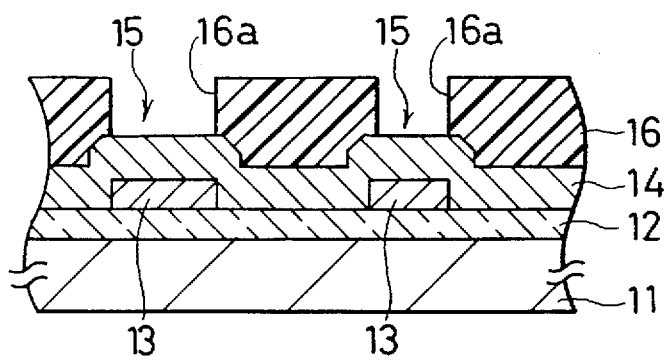

Next, as shown in FIG. 2D, a photoresist film 16 is formed an the interlayer dielectric layer 14 and is patterned so as to have an inverted geometric shape relative to the pattern of the interconnection layer 13, by a photolithography technique. The "inverted geometric shape" of the photoresist film 16 means that the photoresist film 16 has windows 16a through which the lines of the interconnection layer 13 are selectively removed during a subsequent etching process.

Figure 2E:
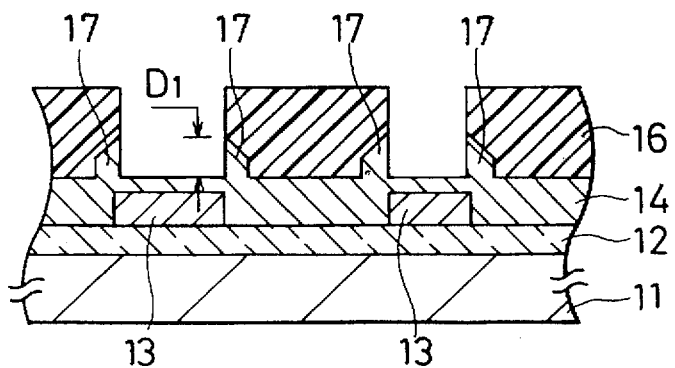

Using the patterned photoresist film 16 as a mask, the interlayer dielectric layer 14 is selectively etched by an anisotropic etching method, thereby removing the top of the protrusions 15 by a depth of $D_1$, as shown in FIG. 2E. For example, the anisotropic etching method may be an RIE method using $CF_4$ or $CHF_3$ gas, and the depth $D_1$ may be approximately 0.4 μm. At this stage, the thickness of the remaining dielectric layer 14 on its top is, for example, approximately 0.4 μm, and the thickness fluctuation thereof is within the range of approximately ±0.1 μm. The photoresist film 16 is then removed.

Since the width $W_{15}$ of the protrusions 15 of the interlayer dielectric layer 14 is wider than the width $W_{13}$ of the lines of the interconnection layer 13, the protrusions 15 are not entirely etched by the above etching process. As a result, unetched parts 17 of the protrusions 15 are left over the both sides of each line of the interconnection layer 13, as shown in FIG. 2F.

The above process steps may be performed using conventional film-formation, photolithography and etching equipment.

Figure 2F:
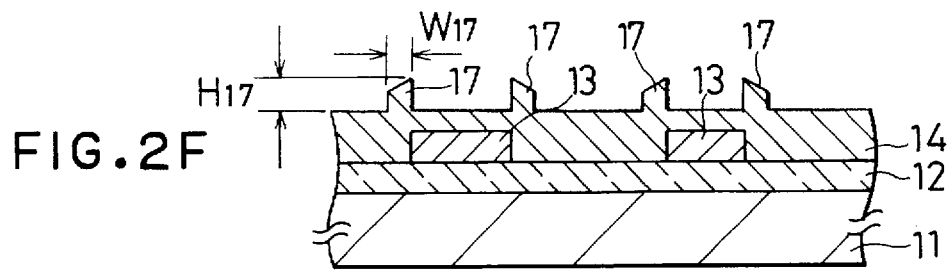
Figure 2G:
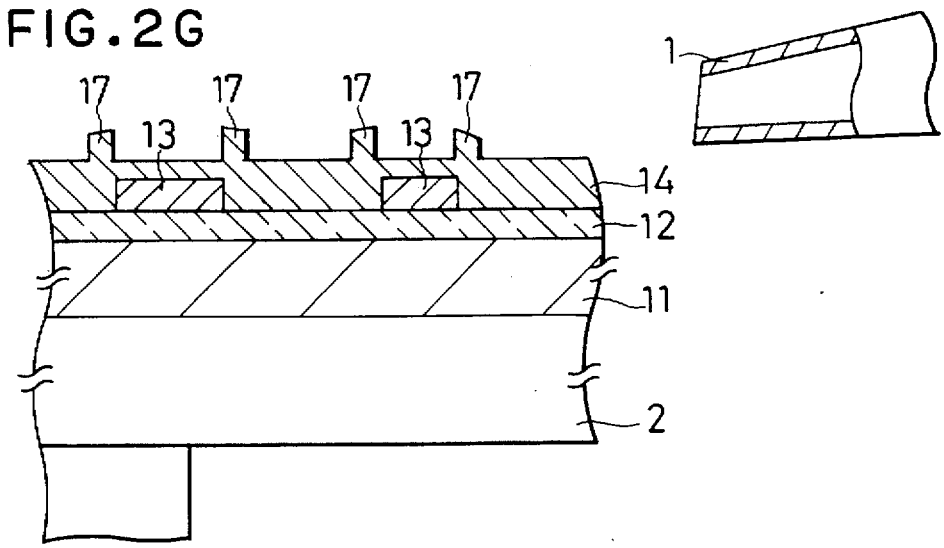

Subsequently, to planarize the surface of the interlayer dielectric layer 14, the semiconductor substrate 11 having the structure shown in FIG. 2F is placed in the form of the semiconductor wafer 11a, and held by the vacuum absorption force on the rotatable table 2 of the planarization equipment shown in FIGS. 5, 6 and 7. The state at this stage is shown in FIG. 2G.

Then, while the table 2 is rotated at a specific speed, the solid particles 18 stored in one of the hoppers and 4a, 4b and 4c are emitted from a corresponding one of the nozzles 1a, 1b and 1c together with the carrier gas. Thus, a beam 40 of the particles 18 travelling along the surface of the dielectric layer 14 is produced.

The beam 40 of solid SiO$_2$ particles 18 is collided with the remaining, netched parts 17 of the interlayer dielectric layer 14, thereby selectively destroying the parts 17.

Thus, the parts 17 are selectively removed from the surface of the layer 14 and as a result, the surface of the layer 14 becomes very flat and smooth.

Figure 2H:
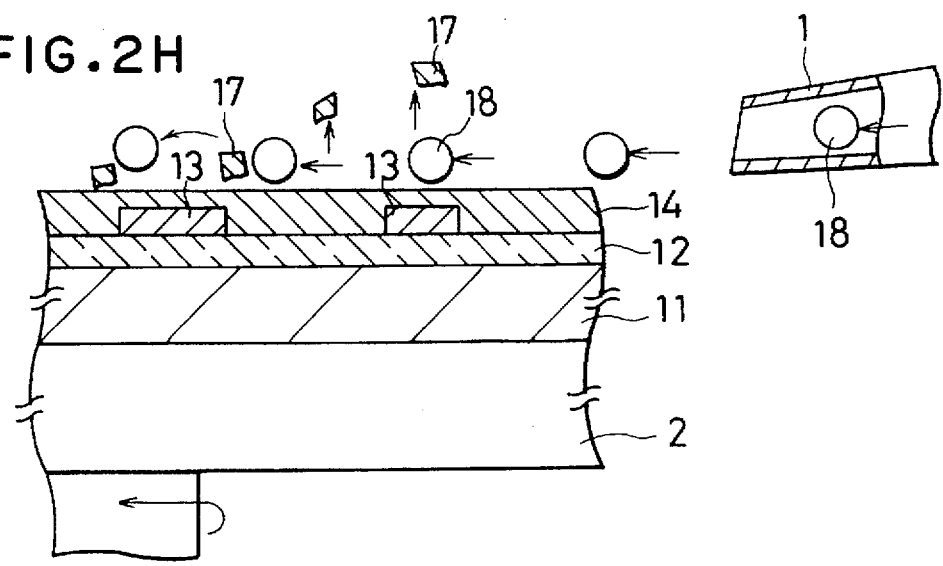

During this planarization process, the surface of the dielectric layer 14 itself is not damaged, as shown in FIG. 2H, because the particles 18 are immediately blown by the flowing carrier gas after the collision.

In consideration with the fact that the substrate 11 has a large diameter of approximately 200 mm in the form of the wafer 11a, the unetched parts 17 are removed while rotating the substrate 11 around the center of the substrate 11. The beam 40 of the solid particles 18 is emitted along the diameter of the wafer 11.

To avoid damage to the surface of the dielectric layer 14, the incident angle θ of the beam 40 of the particles 18 should be kept within a range of 0° to 5° with respect to the surface of the layer 14 (see FIG. 7).

Following this planarization process, similar to the above conventional method shown in FIGS. 1A to 1F, necessary contact holes (not shown) are formed in the interlayer dielectric layer 14 to reach the corresponding lines of the interconnection layer 13 by using conventional methods. A next-level interconnection layer (not shown) is formed on the planarized layer 14 so as to cover the next-level interconnection layer. Further, a next-level interlayer dielectric layer is formed on the underlying next-level interconnection layer. These process steps are repeated a necessary number of times, thereby fabricating a semiconductor integrated circuit device with the multi-level interconnection.

With the planarization method according to the first embodiment, to remove the remaining, unetched protrusions 17 of the interlayer dielectric layer 14, the beam 40 of SiO$_2$ particles 18 is emitted so as to collide with the protrusions 17. Accordingly, the protrusions 17 can be broken and removed without damaging the surface of the interlayer dielectric layer 14. This means that the layer 14 can be planarized while solving the above problem relating to the thickness controllability of the layer 14.

Since the remaining protrusions 17 are removed by collision with the beam 40 of solid particles 18, high removing rate can be obtained, resulting in high throughput for the planarization process. For example, the planarization process can be finished in one minute in the invention. On the other hand, the process is finished in six minutes in the conventional Ar-ion stream method.

Further, the above problem due to contaminants can be solved.

Figure 3:
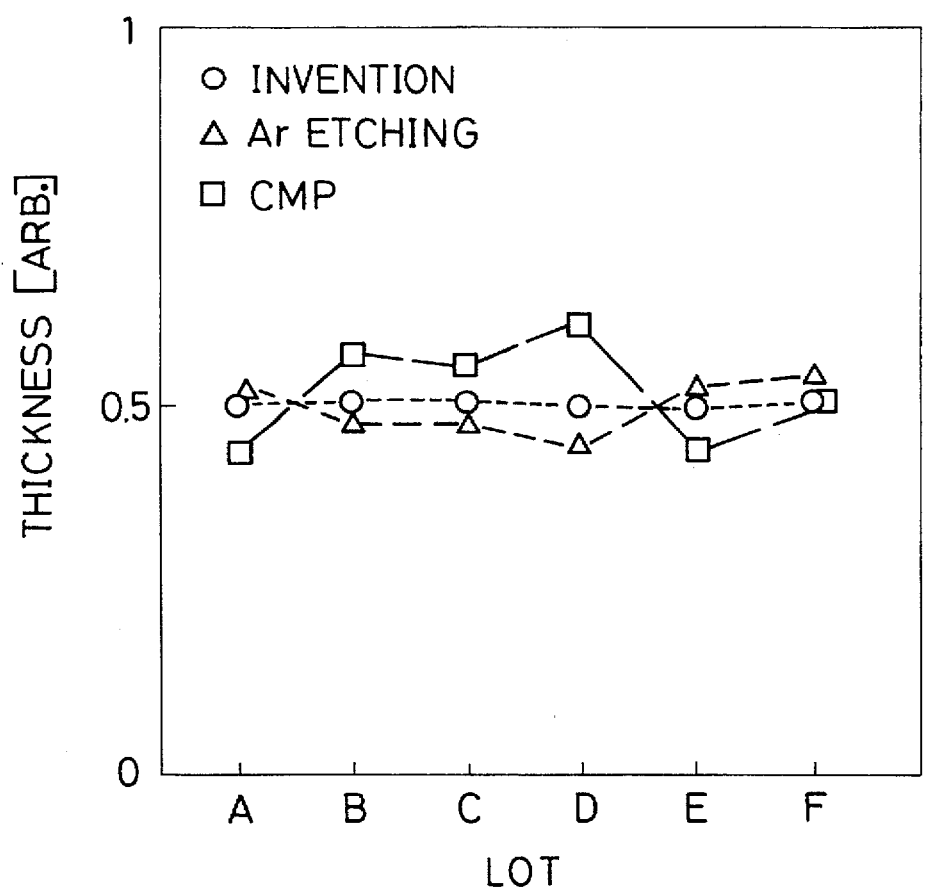
FIG. 3 is a graph comparing the thickness fluctuations of the interlayer dielectric layer in the method according to the first embodiment of the invention and the conventional CMP and Ar-ion stream methods.

FIG. 3 shows the thickness fluctuating of the interlayer dielectric layer 14 in the method according to the first embodiment of the invention and the conventional CMP and Ar-ion stream methods. In FIG. 3, the thickness of the layer 14 is illustrated in an arbitrary unit as a function of the fabrication lot of the wafer 11a. This was obtained through tests by the inventor.

The following fact is seen from FIG. 3:

The thickness fluctuating of the conventional CMP method and the conventional Ar-ion stream method are worse than that of the first embodiment of the invention. The fluctuation of the CMP method is the worst, and that of the Ar-ion stream method is between those of the CMP and the inventive methods.

Through the tests, it is apparent the method of the invention ensures better thickness controllability of the dielectric layer 14 than the prior art.

SECOND EMBODIMENT

Figure 4A:
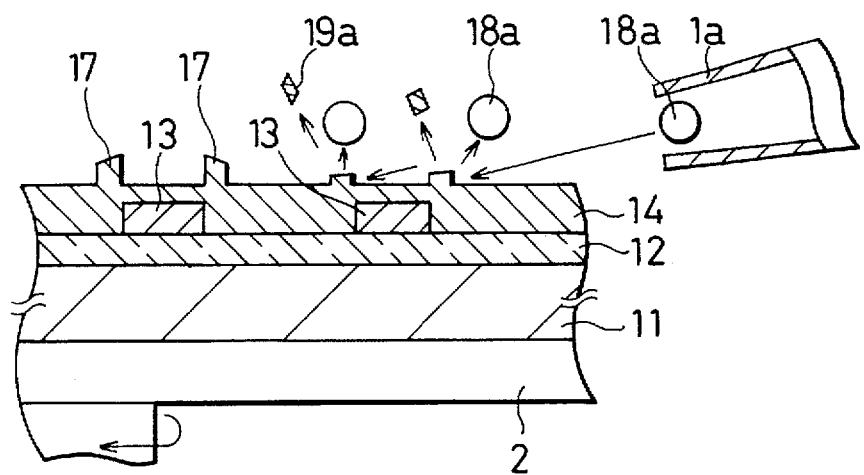
FIGS. 4A and 4B are partial cross-sectional views of a semiconductor substructure, and show a process step sequence of a planarization method according to a second embodiment of the invention.
Figure 4B:
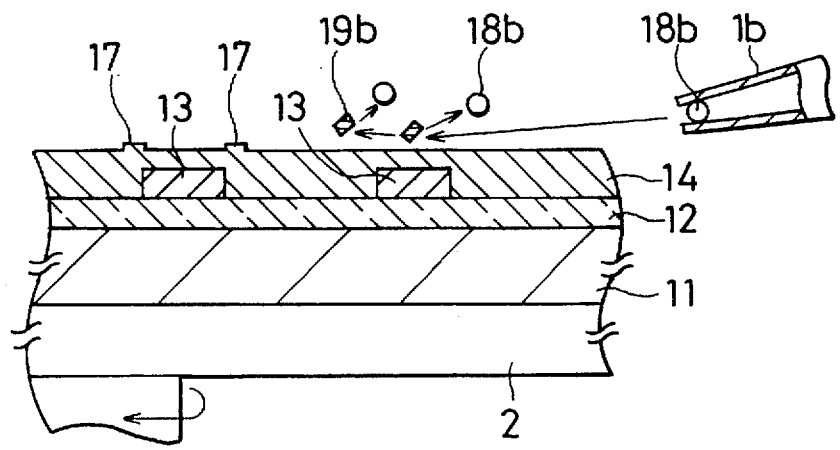

FIGS. 4A and 4B show a process step sequence of a planarization method according to a second embodiment of the invention. This embodiment is performed by using the planarization equipment shown in FIGS. 5, 6 and 7.

The method according to the second embodiment contains the same process steps as those of the first embodiment except that SiO$_2$ particles 18a having different sizes are used.

As shown in FIG. 4A, SiO$_2$ particles 18a having a relatively large size and stored in the hopper 4a are emitted from the nozzle 1a so as to collide with the unetched parts 17 of the dielectric layer 14. During this process, the top half of each of the parts 17 is removed. The reference numeral 19a indicates broken pieces of the parts 17 during this process.

Subsequently, as shown in FIG. 4B, the SiO$_2$ particles 18b having a relatively small size and stored in the hopper 4b are emitted from the nozzle 1b so as to collide with the remaining parts 17 of the dielectric layer 14 again. During this process, the bottom half of each of the parts 17 is removed. The reference numeral 19b indicates broken pieces of the parts 17 during this process.

This embodiment is effective when the unetched parts 17 are comparatively large and crumbly. The reason is that these parts 17 tend to be removed together with the bottoms of the parts 17 if they are removed through a single process and consequently, the underlying interconnection layer 13 tends to be exposed from the dielectric layer 14.

THIRD EMBODIMENT

FIG. 8 shows planarization equipment used for performing planarization methods according to a third embodiment. This equipment has the same structure as that of the equipment shown in FIGS. 5, 6 and 7 except that an ice-making machine 31, heater 32, and shutter 33 are provided instead of hoppers 4a, 4b and 4c. Therefore, the description relating to the same structure is omitted here by using the same reference symbols for similar elements as those of the equipment of FIGS. 5, 6 and 7 for the sake of simplification.

As shown in FIG. 8, the ice-making machine 31 is fixed onto the body 30. The outlet of the machine 31 is designed to be connected to the manifold 5a of the turret 5 through the heater 32 and the shutter 33 and as a result, the ice particles can be emitted through a desired one of the nozzles 1a, 1b and 1c.

The ice-making machine 31 produces ice particles from pure water. As the machine 31, a conventional ice-making machine may be used. For example, pure water is sprayed from a nozzle in a container cooled by liquified nitrogen, thereby forming desired ice particles.

The size or diameter of the ice particles is adjusted by the heater 32. Specifically, the size of the particles is changed depending upon the temperature of the heater 32. The supply of the ice particles to the manifold 5a is controlled by the shutter 33.

In the planarization method according to the third embodiment, since the ice particles are used as the solid particles, the ice particles, after having been collided with the protrusions 15 of the interlayer dielectric layer 14 tend to melt away within a short time.

Therefore, an advantage is obtained in that no bad effect is applied to the planarized wafer 11a.

This equipment can be used for performing the planarization methods according to the first and second embodiments.

In the planarization methods according to the second and third embodiments, for example, when the height $H_{17}$ of the remaining protrusions 17 is approximately 1.2 µm and the size of its bottom is as large as approximately 2 µm, the size and emitting speed of the particles 18 are determined in the following way:

The diameter of the particles 18a may be set to 30 to 50 µm for ice particles, and to 14 to 23 µm for $SiO_2$ particles if the same emitting speed is used. These values are determined based upon the density value of the water ice (approximately 1 g/cm$^3$) and that of $SiO_2$ (approximately 2.2 g/cm$^3$).

Further, the diameter of the particles 18b may be set to 10 to 30 µm for ice particles, and to 5 to 14 µm for the $SiO_2$ particles if the same emitting speed is used. These values also are determined based upon the density values of water ice and $SiO_2$.

The emitting speed of the particles 18 may be, for example, set to approximately 300 mm/cm.

Thus, the size and emitting speed of the solid particles 18, 18a and 18b are determined based upon size of the protrusions 17 and the material of the particles to be used.

The colliding process step by the beam 40 of the solid particles may be repeated three or more times in order not to damage the flat surface of the dielectric layer 14.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of planarizing an interlayer dielectric layer, said method comprising the steps of:
    (a) preparing a semiconductor substructure;
    (b) forming an insulating layer on a chief surface of said substructure;
    (c) forming an interconnection layer having conductive lines on said insulating layer;
    (d) forming an interlayer dielectric layer on said insulating layer so as to cover said interconnection layer, said dielectric layer having protrusions at positions corresponding to said underlying conductive lines of said interconnection layer;
    (e) forming a patterned resist film on said interlayer dielectric layer so as to have an inverted geometric shape relative to that of said interconnection layer;
    (f) selectively etching said interlayer dielectric layer to thereby partially remove tops of said protrusions by a predetermined depth using said patterned resist film as a mask; and
    (g) emitting a beam of solid particles so as to collide with remaining parts of said protrusions of said interlayer dielectric layer so as to destroy and remove said remaining parts of said protrusions so as to planarize said interlayer dielectric layer.

2. A method as claimed in claim 1, wherein said beam of said solid particles is produced by emitting said solid particles from a nozzle together with an inert gas.

3. A method as claimed in claim 1, wherein size of said solid particles is changed during said step of removing said remaining parts of said protrusions of said interlayer dielectric.

4. A method as claimed in claim 1, wherein granular $SiO_2$ pieces are used as said solid particles.

5. A method as claimed in claim 1, wherein ice pieces made from pure water are used as said solid particles.

* * * * *